United States Patent
Lienau et al.

[11] Patent Number: 6,140,139
[45] Date of Patent: Oct. 31, 2000

[54] HALL EFFECT FERROMAGNETIC RANDOM ACCESS MEMORY DEVICE AND ITS METHOD OF MANUFACTURE

[75] Inventors: Richard Lienau, Pecos, N. Mex.; Laurence Sadwick, Salt Lake City, Utah

[73] Assignees: Pageant Technologies, Inc.; Estancia Limited Providencials, both of Turks/Caicos Islands

[21] Appl. No.: 09/218,344

[22] Filed: Dec. 22, 1998

[51] Int. Cl.[7] .................................................. H01L 21/00
[52] U.S. Cl. .................................. 438/3; 438/57; 438/59; 257/421; 257/425; 257/427
[58] Field of Search .................. 438/3, 57, 59; 365/170, 171, 66, 9, 173; 257/427, 425, 421

[56] References Cited

U.S. PATENT DOCUMENTS

| | | |
|---|---|---|
| 5,075,247 | 12/1991 | Mathews ...................................... 438/3 |
| 5,289,410 | 2/1994 | Katti et al. ................................. 365/170 |
| 5,295,097 | 3/1994 | Lienau ....................................... 365/170 |
| 5,329,480 | 7/1994 | Wu et al. ................................... 365/170 |
| 5,477,482 | 12/1995 | Prinz ......................................... 365/129 |
| 5,661,062 | 8/1997 | Prinz ............................................ 438/3 |

Primary Examiner—Charles Bowers
Assistant Examiner—Hsien Ming Lee
Attorney, Agent, or Firm—Thorpe, North & Western

[57] ABSTRACT

A Hall effect ferromagnetic non-volatile random access memory cell comprising a Hall effect sensor adjacent to a ferromagnetic bit which is surrounded by a drive coil. The coil is electrically connected to a drive circuit, and when provided with an appropriate current creates a residual magnetic field in the ferromagnetic bit, the polarity of which determines the memory status of the cell. The Hall effect sensor is electrically connected via four conductors to a voltage source, ground, and two read sense comparator lines for comparing the voltage output to determine the memory status of the cell. The read and write circuits are arranged in a matrix of bit columns and byte rows. A method for manufacturing said Hall effect ferromagnetic non-volatile random access memory cell.

33 Claims, 7 Drawing Sheets

HALL EFFECT FERROMAGNETIC RANDOM ACCESS MEMORY DEVICE AND ITS METHOD OF MANUFACTURE

BACKGROUND OF THE INVENTION

1. Field of the Invention

This invention relates generally to nonvolatile random access magnetic memory devices.

More particularly, the present invention relates to an improved Hall effect ferromagnetic random access memory cell and its method of fabrication.

2. State of the Art

The Hall effect is an electromagnetic phenomenon whereby a conductor carrying an electric current perpendicular to an applied magnetic field develops a voltage gradient which is transverse to both the current and the magnetic field. This principle has been applied in many electromagnetic devices, including those constructed with semiconducting materials to produce field effect transistors (FETs).

FETs are well known and have been used to create digital memory devices. For example, U.S. Pat. No. 5,295,097 to Lienau teaches a Hall effect memory device comprising a domain made of ferromagnetic material, substantially surrounded by a conducting coil. When the coil is supplied with an electric current, a residual magnetic field is created in the domain, the polarity of this magnetic field depending on the direction of the current of the coil. This is how digital information is written to the domain. A FET is disposed so as to be perpendicularly penetrated by this field, the differential voltage across the drains of the FET indicating the polarity of the magnetic field. This is how digital information is read from the domain.

While these devices are known in the art, they are somewhat difficult and costly to construct. Additionally, fabrication constraints affect the density of placement of the devices on a computer chip, and thus affect the overall size of digital computer components. It would be desirable to have a hall effect ferromagnetic random access memory device that is less expensive and less difficult to fabricate, and which is also smaller and may be disposed on a microchip in greater density.

OBJECTS AND SUMMARY OF THE INVENTION

It is therefore an object of the present invention to provide a Hall effect ferromagnetic random access memory cell that is easier and less expensive to mass produce than other such devices.

It is another object of the invention to provide a Hall effect ferromagnetic random access memory cell that provides better signal sensing capabilities than other such devices.

It is another object of the invention to provide a method of mass producing such cells that is easier and less expensive to mass produce than prior devices.

It is yet another object of the invention to provide a random access memory circuit that is comprised of a matrix of Hall effect ferromagnetic random access memory cells constructed according to this invention.

It is another object of the invention to provide Hall effect ferromagnetic random access memory cells that are reproducible in their behavior and give a high yield.

The above and other objects are realized in a method of manufacturing a Hall effect ferromagnetic non-volatile random access memory cell comprising the steps of providing a piece of substrate material; depositing upon the surface of the substrate a Hall sensor material; depositing upon the surface of the substrate interconnect lines for electrically connecting the Hall sensor material to its source and drains; depositing upon the Hall sensor material and the interconnect lines a first layer of insulating material; depositing upon the first layer of insulating material a thin layer of ferromagnetic material; depositing an additional desired thickness of ferromagnetic material upon the thin layer of ferromagnetic material; forming the ferromagnetic material into a magnetically polarizable domain having a long axis substantially perpendicular or normal to the plane of the substrate; depositing upon the ferromagnetic material a second layer of insulating material; depositing upon the second layer of insulating material a thin layer of electrically conductive material by means of electron beam deposition, sputtering, or other thin film deposition technique; depositing on the thin layer of electrically conductive material an additional desired thickness of electrically conductive material by the process of electroplating; forming the electrically conductive material into a coil substantially surrounding the length of the domain and configured to produce a residual magnetic field therein when an electrical current is applied to the coil; depositing upon the surface of the electrically conductive material and the second layer of insulating material interconnect lines for uniquely electrically connecting the coil to a bit write line and a word write line; and coating the entire cell structure with a passivation layer.

These and other objects are also realized in a Hall effect ferromagnetic non-volatile random access memory apparatus comprising a substrate having a plurality of elongate, magnetically polarizable domains oriented with their long axis substantially normal to the substrate. A plurality of word write lines and bit write lines are also carried by the substrate, and a plurality of conductive coil members are connected thereto, each between one of the word write lines and one of the bit write lines and substantially surrounding and being coupled to one of the domains and having a central axis oriented substantially parallel to the long axis of the domains.

Other objects and features of the present invention will be apparent to those skilled in the art, based on the following description, taken in combination with the accompanying drawings.

DETAILED DESCRIPTION OF THE PREFERRED EMBODIMENT

Figure 1:
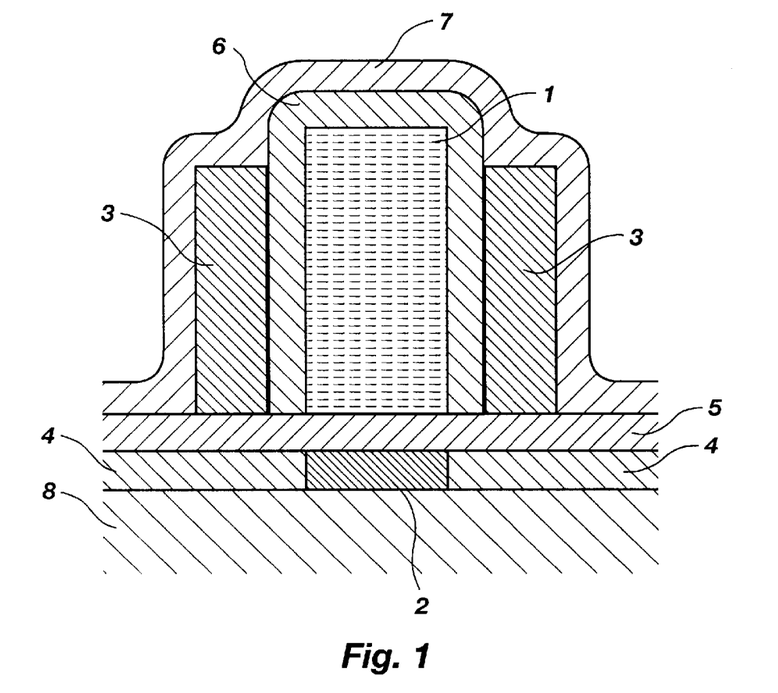
FIG. 1 provides a lateral cross section through a Hall Effect Ferromagnetic Random Access Memory (HFRAM) cell according to the present invention.

Referring now to the drawings:

FIG. 1 provides a lateral cross section through a Hall Effect Ferromagnetic Random Access Memory (HFRAM) cell according to the present invention. This sectional view is taken through section B—B of FIG. 3, which provides a top sectional view of the same HFRAM cell. Beginning at the bottom of FIG. 1, the chip is formed on a substrate material 8 preferably comprised of glass, silicon (Si), gallium arsenide (GaAs) or other suitable material known in the art. In one embodiment of the present invention, the substrate 8 may comprise a layer of finished integrated circuitry devices, thus providing greater component density than other devices.

Immediately atop the substrate 8 is a Hall effect sensor 2, which is typically connected to four conductors 4 (two of which are visible in the sectional view of FIG. 1) which connect the sensor to the sense, or read, matrix. Above the layer containing the sensor 2 and conductors 4 is a layer of insulating material 5. This insulating material is preferably silicon nitride ($Si_3N_4$) or silicon dioxide ($SiO_2$), but other suitable insulating materials known in the art may be used. The insulating material 5 separates the sense conductors 4 from the write, or storage drive coil 3, shown in cross-section in this view.

The storage drive coil 3 wraps around the ferromagnetic bit 1, with an intervening layer of insulating material 6 disposed therebetween. The ferromagnetic bit 1 is preferably formed of a ferromagnetic material selected from the group comprising iron, cobalt, nickel, gadolinium, indium arsenide, silicon, gallium arsenide, and indium antimonide. Other materials known in the art may also be suitable in accordance with the principles of this invention. The ferromagnetic bit is preferably oriented with its long axis approximately perpendicular to the plane of the Hall effect sensor (and, in this embodiment, the plane of the substrate), so as to create a proper magnetic flux. The ratio of the length of the domain to its width in the plane of the substrate should be greater than 1:1, with a ratio of 2:1 or greater being preferable. The coil is formed of a conducting material, such as silver, copper, gold, aluminum, or other conductive material known in the art. The insulating material 6 is preferably silicon nitride ($Si_3N_4$) or silicon dioxide ($SiO_2$), but other suitable insulating materials known in the art may be used. The entire cell structure is overlain by an insulating cover 7, preferably made of silicon dioxide ($SiO_2$) or silicon nitride ($Si_3N_4$), though other materials known in the art may be advantageously used.

Figure 3:
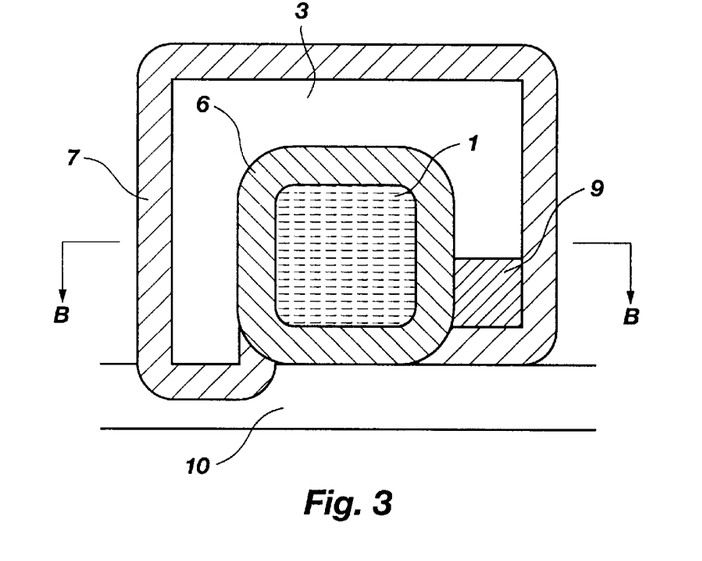
FIG. 3 provides a top sectional view of a HFRAM cell according to the present invention.
Figure 7:
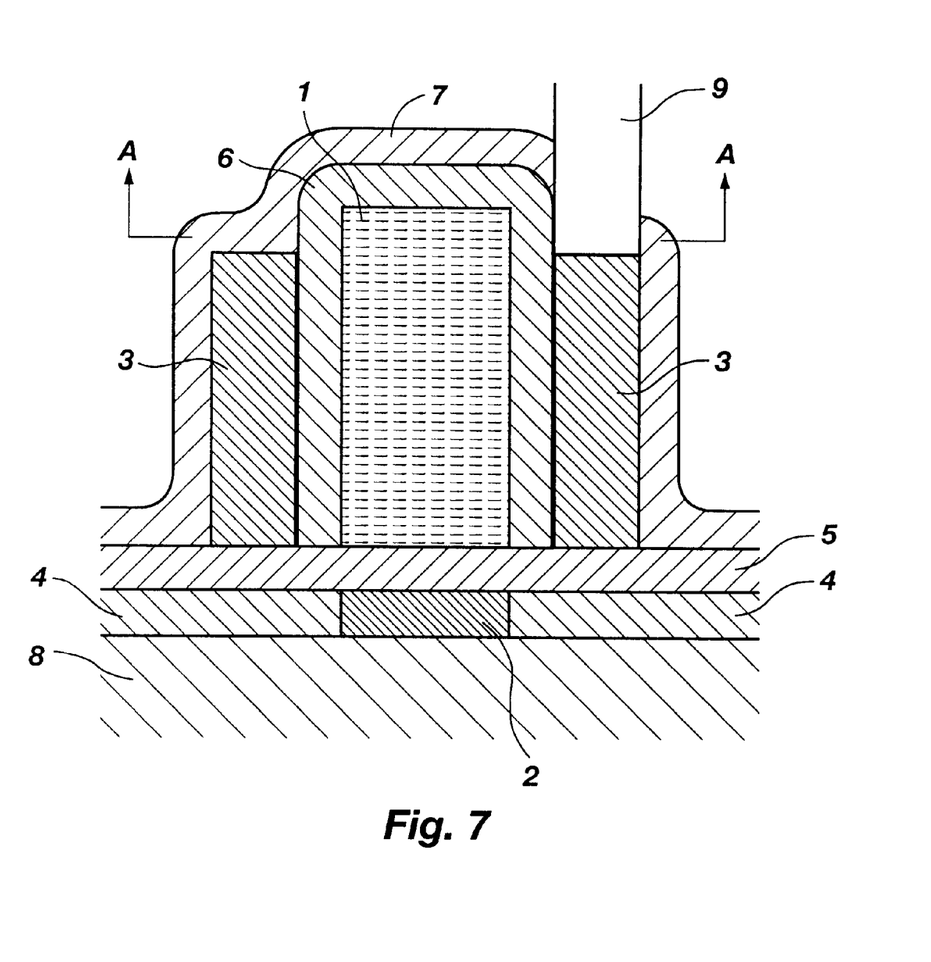
FIG. 7 provides a lateral cross section through the HFRAM cell of FIG. 1 showing a via emanating from the right side of the coil.
Figure 8:
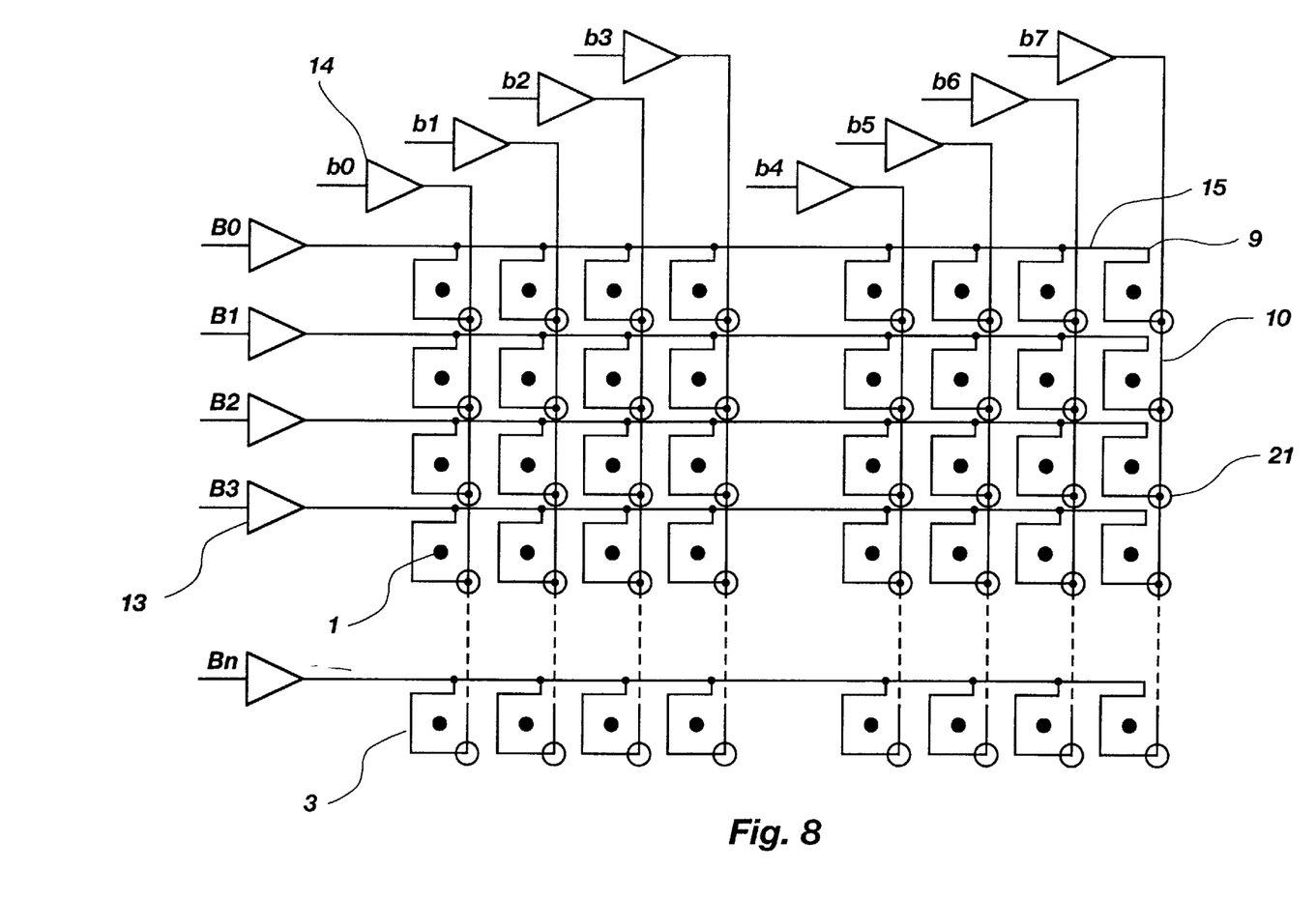
FIG. 8 is a schematic diagram of a typical write, or storage drive, matrix layout interconnecting an array of HFRAM memory cells according to the present invention.

The wrapped configuration of the storage drive coil 3 around the ferromagnetic bit 1 is more clearly shown in FIG. 3, which is a top sectional view of the HFRAM cell taken through section A—A of FIG. 7. In this view, the coil 3 is shown overlying the bit drive write line 10 on one end, and having a via 9 extending out from the plane of the figure on its other end. The coil 3 is electrically connected at the one end to the drive write line 10, and the via 9 connects the other end of the coil 3 to the byte drive line 15, shown more clearly in the schematic diagram of FIG. 8. The configuration of the bit and byte drive lines, 10 and 15, are shown for reference only, and in practice may be reversed from the orientation shown.

Figure 2:
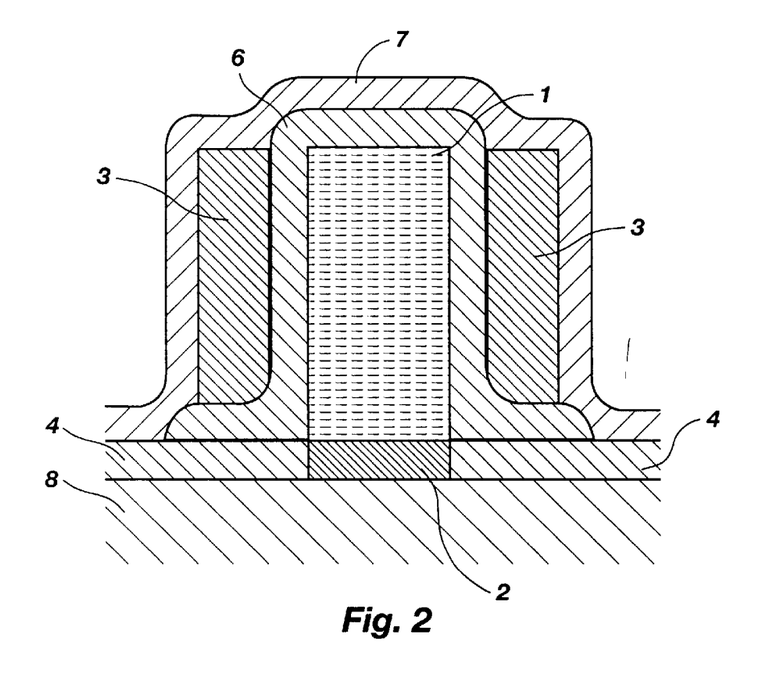
FIG. 2 provides a lateral cross section through an alternative embodiment of an HFRAM cell according to the present invention in which the ferromagnetic bit lies directly atop the sensor.

FIG. 2 provides a lateral cross section through an alternative embodiment of an HFRAM cell according to the present invention. The cell of this embodiment is identical to that of FIG. 1 except that the insulating layer 5 is absent, and the ferromagnetic bit 1 lies directly atop the sensor 2. This configuration is possible because, although the ferromagnetic material of the bit is conductive, it is isolated from the storage, or write, drive circuit 3 by the insulator 6, and thus electrically is not part of the write drive circuit. In the depiction of FIG. 2 the insulator 6 is shown extended below the coil 3, thus electrically isolating the write drive and read sense circuits. This configuration provides the advantage of having the sensor 2 closer to the bit 1, which enhances the signal-to-noise ratio because the sensor is placed in the most intense part of the magnetic field.

Figure 4:
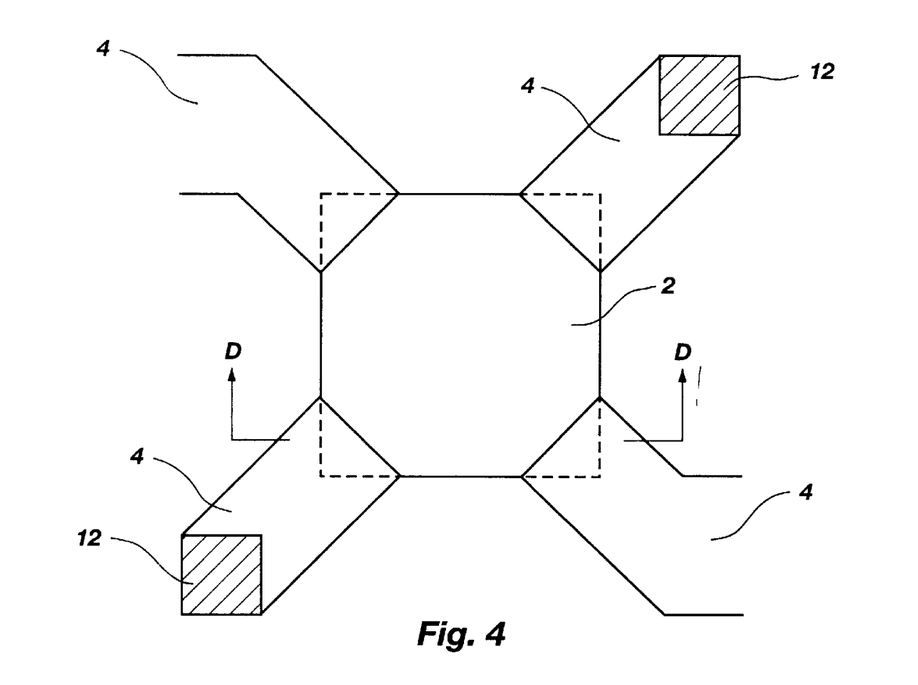
FIG. 4 provides a top view of an alternative embodiment of the sensor and conductor arrangement for an HFRAM cell according to the present invention.
Figure 9:
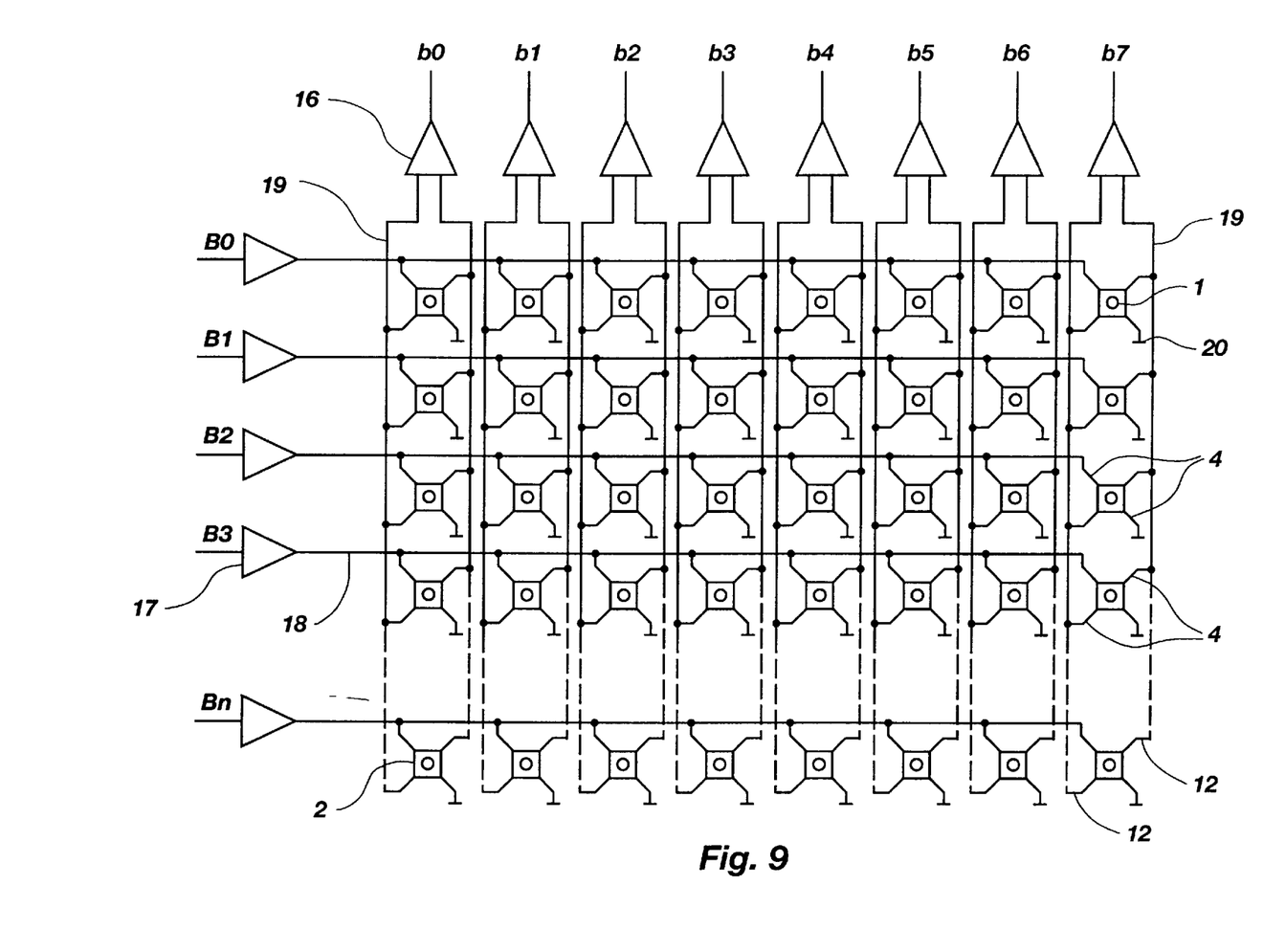
FIG. 9 provides a schematic diagram of a typical read, or sense drive, matrix layout interconnecting an array of HFRAM memory cells according to the present invention.

FIG. 4 provides a top view of an alternative embodiment of the sensor and conductor arrangement for an HFRAM cell according to the present invention. This view is taken through section C—C of FIG. 5. This embodiment is a "classic" Hall effect device, in which the Hall conductor region is comprised of indium antimonide (InSb), indium arsenide (InAs), gallium arsenide (GaAs), silicon (Si), or other appropriate Hall effect coefficient material. Other forms of sensors may also be used, including those which create variations of the Hall effect, but in all cases the sensing device must be capable of determining the direction or polarity of the magnetic field emanating from the ferromagnetic bit 1. In FIG. 4, the four conductors 4 are shown overlapping the edge of the sensor 2, having a top connection, rather than a butt connection as depicted in FIGS. 1, 2, & 7. A side view of this type of configuration is given in FIG. 5. This configuration reduces the overall thickness of the device, and thereby increases the allowable density of these devices on a semiconductor chip. In FIG. 4, two of the four conductors 4 are shown with vias 12, depicted in such a way as to indicate that they are extending out of the plane of the drawing. These are in turn connected to the read sense comparator lines 19 (FIG. 9).

Figure 5:
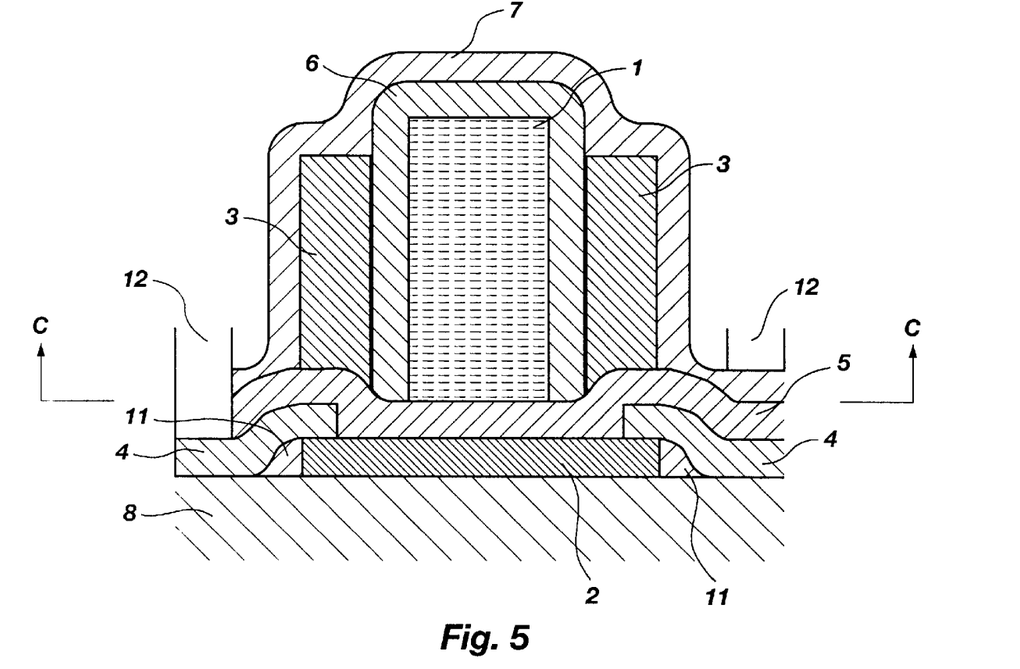
FIG. 5 provides a lateral cross section through an alternative embodiment of the HFRAM cell of the present invention in which the conductors overlie rather than abut the sensor.

FIG. 5 provides a lateral cross section through another alternative embodiment of the HFRAM cell of the present invention in which the conductors 4 overlie rather than abut the sensor 2. As noted above, this configuration also provides manufacturing simplicity and cost advantages, and increases the allowable density of components on a semiconductor chip. The view of FIG. 5 is taken through section D—D of FIG. 4. In this embodiment, the sensor 2 is approximately twice as large as its counterpart in FIGS. 1 or 2, and the sense conductors 4 contact the sensor 2 on its top as in FIG. 4, rather than butting against it as in FIGS. 1, 2, & 7. The embodiment of FIG. 5 also includes an insulating layer 5 between the sensor and the bit 1, however, this insulator 5 is configured to conform to the rise caused by the sense conductors 4. This rise may also cause a gap 11 between the under surface of the conductors 4 and the edge of the sensor 2, which is preferably filled with an insulating material such as silicon nitride ($Si_3N_4$), or other suitable insulating material known in the art.

Figure 6:
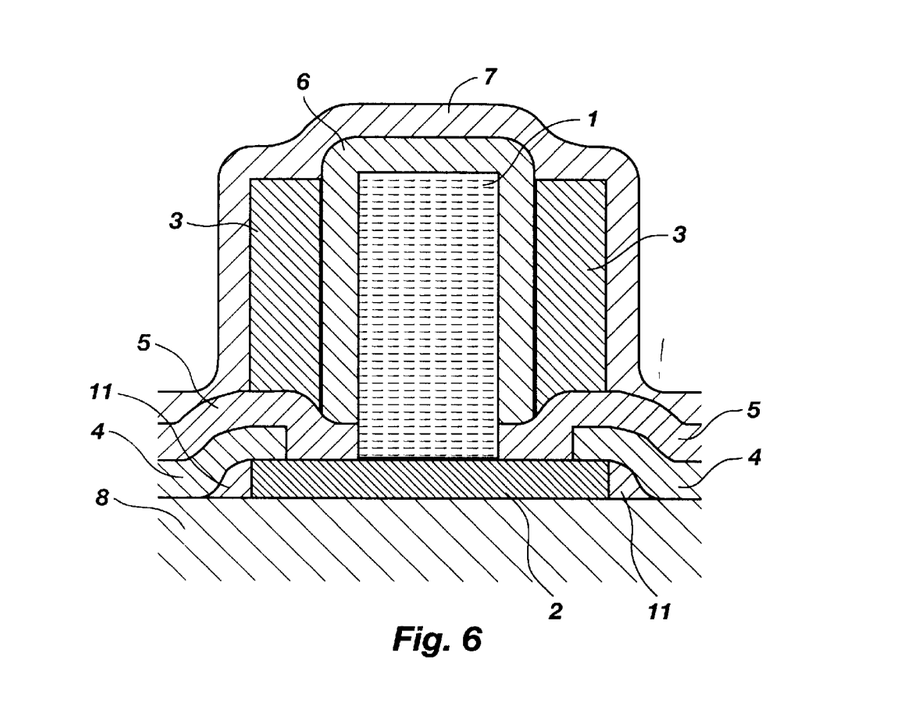
FIG. 6 provides a lateral cross section through an alternative embodiment of the HFRAM cell of the present invention wherein the conductors overlie rather than abut the sensor, and the ferromagnetic bit lies directly atop the sensor.

The unique features of the embodiments of FIG. 2 and FIG. 5 may be advantageously combined to provide an HFRAM cell having all of those advantages. FIG. 6 provides a lateral cross section through an alternative embodiment of the HFRAM cell of the present invention incorporating these features. The conductors 4 overlie rather than abut the sensor 2, and the ferromagnetic bit 1 lies directly atop the sensor 2. The principle advantages of this configuration are that it increases sensor sensitivity, and makes the manufacturing process simpler and less costly.

FIG. 7 provides a lateral cross section through the HFRAM cell of FIG. 1 showing a via 9 emanating from the right side of the coil 3. As noted above, the via 9 connects one end of the coil 3 to the byte drive line 15. The byte drive line 15 is shown more clearly in FIG. 8, which provides a schematic diagram of a typical write, or storage drive, matrix layout interconnecting an array of HFRAM memory cells according to the present invention. The matrix is in a typical 8-bit byte configuration, with bits $b_0$ through $b_7$ and bytes $B_0$ through $B_n$. It will be apparent to one skilled in the art that this configuration is typical of computer memory devices. However, the present invention is in no way limited to devices configured in this manner. The ferromagnetic bits 1 are shown centered in reference to the write drive coils (or loops) 3. Each cell coil or loop 3 is interconnected electrically to the write drive matrix through the bit drive lines 10 and the vias 9 to the byte drive lines 15. The bit drive circuitry is represented in this figure by objects 14, and the byte drive circuits are represented by objects 13. Objects 21 represent individual bit matrix select circuitry, which may be constructed in any suitable manner known in the art.

Figure 10:
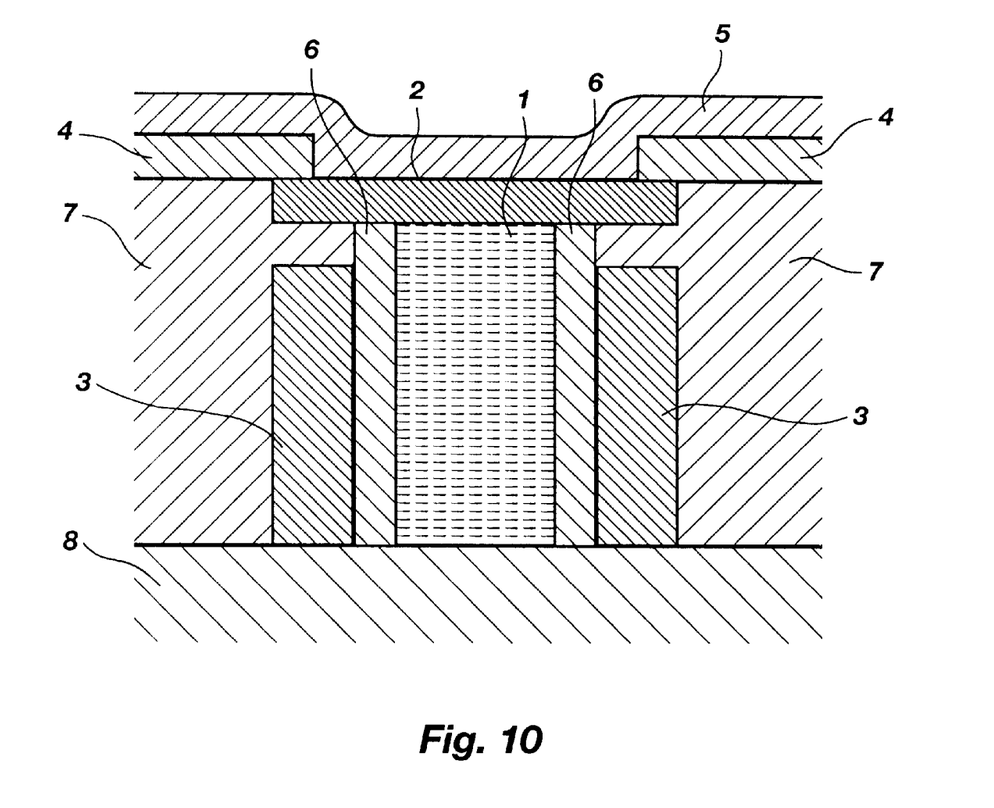
FIG. 10 provides a lateral cross section through an alternative embodiment of the HFRAM cell of the present invention wherein the ferromagnetic bit is disposed directly on the substrate and the sensor is disposed directly over the ferromagnetic bit.

FIG. 9 provides a schematic diagram of a typical read, or sense drive, matrix layout interconnecting an array of HFRAM memory cells according to the present invention. As above, this matrix is also in a typical 8-bit byte configuration, with bits $b_0$ through $b_7$ and bytes $B_0$ through $B_n$. In this depiction, the sensors are "classic" Hall effect sensors, as noted in the discussion of FIG. 4 above, but the invention here described is not restricted to such. The ferromagnetic bits 1 are centered with respect to the sensors 2, and may be disposed over the sensors as heretofore depicted, or disposed under the sensors as depicted in FIG. 10 (described in more detail below). Each sensor is electrically interconnected to the read drive matrix through sense connectors 4. The byte row drive select lines 18 connect to each sensor in a row through a connector 4. When a given byte row is selected, current flows from the byte selection and drive circuit 17 through the line 18, the sensor 2, and thence to the common ground 20 through a matching sensor conductor 4. In this case, the Hall voltage developed across the sensor as a result of the current applied across the sensor 2 by the byte drive current and biased by the magnetic field emanating from the ferromagnetic bit 1 is transmitted through the second set of sensor connectors 4 and the vias 12 to the sense lines 19 and thence to the bit sense comparators 16, $b_0$ through $b_7$. Line 20 connects each cell to ground.

FIG. 10 provides a lateral cross section through an alternative embodiment of the HFRAM cell of the present invention wherein the ferromagnetic bit 1 is disposed directly on the substrate 8, and the sensor 2 is disposed directly above the ferromagnetic bit, rather than under it as in previous depictions. All other feature relationships remain the same as in FIGS. 1, 2, 5, 6, and 7. As will be apparent to one skilled in the art, the memory cells of the present invention may be disposed over other integrated circuitry, such as other layers of HFRAM cells, transistors, etc., such as in a processor chip, or other circuitry requiring non-volatile RAM.

The HFRAM cell of this invention is advantageously manufactured in the following manner. First, a piece of substantially planar substrate material is provided. This substrate material is preferably a conductive material. Next, a layer of insulating material is deposited upon the surface of the substrate. This step must be performed before the Hall sensor material is deposited. Upon the surface of the insulating material and substrate, a Hall sensor material is deposited. The Hall sensor material may be indium antimonide (InSb), gadolinium, manganese, or other suitable materials. Next, interconnect lines for electrically connecting the Hall sensor material to its source and drains are deposited upon the surface of the substrate wafer, and then a first layer of insulating material is deposited upon the Hall sensor material and the interconnect lines.

At this point, the ferromagnetic domain must be formed on the substrate. To do so, first, a thin layer of ferromagnetic material is deposited upon the layer of insulating material mentioned above. Suitable materials for forming the domain include but are not limited to iron, cobalt, nickel, gadolinium, indium arsenide, silicon, gallium arsenide, and indium antimonide. The domain may be deposited on the substrate by any suitable thin film deposition process, such as electroplating, sputtering, electron beam deposition, chemical vapor deposition, or others known in the art. Then, an additional desired thickness of ferromagnetic material is deposited on this thin layer by the same process, until a ferromagnetic domain of suitable mass is created.

This ferromagnetic material is then shaped and formed into a magnetically polarizable domain having a long axis substantially perpendicular to the plane of the substrate, so as to retain a residual magnetic field with a magnetic flux in a desired direction exposed to an electrical field by the drive coil. A second layer of insulating material is then deposited upon the ferromagnetic domain material, and the device is ready for the application of the drive coil.

The drive coil must be formed to substantially surround the long axis of the Hall sensor material. It is created in the following manner. First, a thin layer of electrically conductive material is deposited upon the second layer of insulating material mentioned above. This may be done by means of electron beam deposition or other suitable thin film deposition techniques. An appropriate material for forming this coil is any electrically conductive material, preferably a metal such as copper, silver, aluminum, or gold. After the thin layer of conductive material is in place, an additional desired thickness of electrically conductive material is deposited on this thin layer by electroplating or some other similar thin film deposition process to obtain a sufficient mass of conducting coil material. As with the ferromagnetic domain, the electrically conductive material must be formed into a coil substantially surrounding the length of the domain, so as to be configured to produce a residual magnetic field in the domain when an electrical current is applied to the coil.

After the domain and coil are completed, interconnect lines for uniquely electrically connecting the coil to a bit write line and a word write line are deposited upon the surface of the electrically conductive material and the second layer of insulating material. To complete the cell, the entire cell structure is coated with a passivation layer as mentioned above.

After the above steps are completed, the electrical function of the cell structure is preferably tested to determine whether it functions properly, and the substrate material is cut into an appropriate size and shape for bonding each individual cell to a header. In this way, a plurality of cells as described herein may be interconnected to form a random access memory matrix as described above.

It is noted that there are many materials and methods that can be used to fabricate many of the preferred embodiment's structures. Hall sensor material may be selected from the group comprising indium antimonide (InSb), gadolinium, and manganese. The domain may be formed from a ferromagnetic material selected from the group comprising iron, cobalt, nickel, gadolinium, indium arsenide, silicon, gallium arsenide, and indium antimonide. The domain and the electrically conductive material formed into a coil are deposited by a method selected from the group consisting of electroplating, sputtering, electron beam deposition, and chemical vapor deposition. The ferromagnetic material is doped with a non-ferrous material that may be selected from the group consisting of aluminum, barium, boron, copper, chromium, molybdenum, and vanadium. The electrically conductive material for functioning as a coil is selected from the group consisting of copper, silver, aluminum, and gold. The passivation layer is selected from the group consisting of silicon, gallium arsenide, quartz, and glass.

It is to be understood that the above-described arrangements are only illustrative of the application of the principles of the present invention. Numerous modifications and alternative arrangements may be devised by those skilled in the art without departing from the spirit and scope of the present invention and the appended claims are intended to cover such modifications and arrangements.

What is claimed is:

1. A method of manufacturing a Hall effect ferromagnetic non-volatile random access memory cell, comprising the steps of:
    a) providing a piece of substantially planar substrate material;
    b) depositing upon the surface of said substrate a substantially planar layer of Hall sensor material, and a magnetically polarizable domain formed of ferromagnetic material, said domain having a long axis substantially perpendicular to the plane of the Hall sensor material;
    c) depositing upon said ferromagnetic material a first layer of insulating material;
    d) depositing upon said first layer of insulating material an electrically conductive material formed into a coil substantially surrounding the length of said domain and configured to produce a residual magnetic field therein when an electrical current is applied to said coil;
    e) depositing interconnect lines upon the surface of said substrate for electrically connecting said Hall sensor material to a source and a pair of drains;
    f) depositing interconnect lines upon the surface of said substrate for uniquely electrically connecting said coil to a bit write line and a word write line; and
    g) coating the entire cell structure with a passivation layer.

2. The method described in claim 1 wherein the step of providing a piece of substantially planar substrate material further comprises providing a substrate material that is electrically conductive.

3. The method described in claim 1 wherein the substrate comprises a substrate incorporating other finished integrated circuitry devices.

4. The invention as described in claim 1 wherein the Hall sensor material is selected from the group comprising indium antimonide (InSb), gadolinium, and manganese.

5. The method described in claim 1 wherein the step of depositing upon the surface of said substrate a substantially planar layer of Hall sensor material, and a magnetically polarizable domain formed of ferromagnetic material, further comprises the steps of:
    h) depositing the Hall sensor material directly upon the surface of said substrate;
    i) depositing upon said Hall sensor material said layer of ferromagnetic material, and forming said ferromagnetic material into a magnetically polarizable domain having a long axis substantially perpendicular to the plane of the Hall sensor material.

6. The method described in claim 5, further comprising the step of depositing a second layer of insulating material upon said Hall sensor material before depositing the ferromagnetic domain thereon.

7. The method described in claim 1 wherein the step of depositing upon the surface of said substrate a substantially planar layer of Hall sensor material, and a magnetically polarizable domain formed of ferromagnetic material, further comprises the steps of:
    j) depositing a layer of ferromagnetic material directly upon the surface of said substrate, and forming said ferromagnetic material into a magnetically polarizable domain having a long axis substantially perpendicular to the plane of the substrate;
    k) depositing the Hall sensor material upon the end of said ferromagnetic domain opposite the substrate.

8. The method described in claim 7, further comprising the step of depositing a spacing layer of insulating material upon the end of said ferromagnetic domain opposite the substrate before depositing the Hall sensor material thereon.

9. The invention as described in claim 1 wherein the domain is formed from a ferromagnetic material selected from the group comprising iron, cobalt, nickel, gadolinium, indium arsenide, silicon, gallium arsenide, and indium antimonide.

10. The invention as described in claim 1 wherein the domain and the electrically conductive material formed into a coil are deposited by a method selected from the group consisting of electroplating, sputtering, electron beam deposition, and chemical vapor deposition.

11. The invention as described in claim 1 wherein the ferromagnetic material is doped with a non-ferrous material.

12. The invention as described in claim 11 wherein the non-ferrous material is selected from the group consisting of aluminum, barium, boron, copper, chromium, molybdenum, and vanadium.

13. The invention as described in claim 1 wherein the electrically conductive material for functioning as a coil is selected from the group consisting of copper, silver, aluminum, and gold.

14. The invention as described in claim 1 wherein the passivation layer is selected from the group consisting of silicon, gallium arsenide, quartz, and glass.

15. The invention as described in claim 1, further comprising the steps of:
    l) depositing a first substantially planar piece of Hall sensor material directly upon the surface of said substrate; and
    m) depositing upon said Hall sensor material said layer of ferromagnetic material, and forming said ferromagnetic material into a magnetically polarizable domain having a long axis substantially perpendicular to the plane of the Hall sensor material.

16. The invention as described in claim 1, further comprising the steps of:
    o) testing the electrical function of said cell structure; and p) cutting said substrate material into an appropriate size and shape for bonding an individual cell to a header.

17. A method of manufacturing a Hall effect ferromagnetic non-volatile random access memory cell comprising the steps of:
   a) providing a piece of substantially planar substrate material;
   b) depositing upon the surface of said substrate a substantially planar layer of Hall sensor material;
   c) depositing interconnect lines upon the surface of said substrate for electrically connecting said Hall sensor material to a source and drains;
   d) depositing upon said Hall sensor material and said interconnect lines a first layer of insulating material;
   e) depositing upon said first layer of insulating material a layer of ferromagnetic material;
   f) depositing on said thin layer of ferromagnetic material an additional thickness of ferromagnetic material;
   g) forming said ferromagnetic material into a magnetically polarizable domain having a long axis substantially perpendicular to the plane of the substrate;
   h) depositing upon said ferromagnetic material a second layer of insulating material;
   i) depositing upon said second layer of insulating material a layer of electrically conductive material;
   j) depositing on said thin layer of electrically conductive material an additional thickness of electrically conductive material;
   k) forming said electrically conductive material into a coil substantially surrounding the length of said domain and configured to produce a residual magnetic field therein when an electrical current is applied to said coil;
   l) depositing interconnect lines upon the surface of said electrically conductive material and said second layer of insulating material, said interconnect lines being configured for uniquely electrically connecting said coil to a bit write line and a word write line; and
   m) coating the entire cell structure with a passivation layer.

18. A method of manufacturing a Hall effect ferromagnetic non-volatile random access memory cell, comprising the steps of:
   a) providing a planar substrate material;
   b) depositing, above the substrate, a magnetically polarizable domain, having a longer axis that is oriented perpendicular to the substrate, and a residual magnetic field oriented along the longer axis;
   c) depositing a Hall sensor, proximate to the domain, to contact the residual magnetic field;
   d) depositing a first layer of insulating material over the domain; and
   e) depositing, over the first layer of insulating material, an electrically conductive write trace surrounding a portion of the domain to produce the residual magnetic field in the domain when applying an electrical current therearound.

19. The method of claim 18, further comprising the step of:
   g) depositing second interconnect lines to electrically connect the write traces to a bit write line and a word write line.

20. The method of claim 19, wherein the Hall sensor having a source and a pair of drains, wherein the source and pair of drains are each coupled to the interconnect lines.

21. The method described in claim 20, wherein the substrate comprises other integrated circuit devices.

22. The invention as described in claim 20, wherein the Hall sensor is made of material selected from the group comprising indium antimonide (InSb), gadolinium, and manganese.

23. The invention as described in claim 22, wherein the domain is formed from a ferromagnetic material selected from the group comprising iron, cobalt, nickel, gadolinium, indium arsenide, silicon, gallium arsenide, and indium antimonide.

24. The invention as described in claim 23, wherein the domains and the interconnect lines are formed by a method selected from the group consisting of electroplating, sputtering, electron beam deposition, and chemical vapor deposition.

25. The invention as described in claim 23, wherein the passivation layer is selected from the group consisting of silicon, gallium arsenide, quartz, and glass.

26. The method described in claim 20, wherein the Hall sensor is deposited below the domain.

27. The method described in claim 26, further comprising the step of depositing a second layer of insulating material upon said Hall sensor before depositing the domains thereon.

28. The method described in claim 20, wherein the Hall sensor is deposited above the domain.

29. The method described in claim 20, wherein the domain comprises magnetically polarizable material.

30. The invention as described in claim 20, wherein the ferromagnetic material is doped with a non-ferrous material.

31. The invention as described in claim 30, wherein the non-ferrous material is selected from the group consisting of aluminum, barium, boron, copper, chromium, molybdenum, and vanadium.

32. The invention as described in claim 20, depositing interconnect lines that electrically connect to the Hall sensors.

33. The invention as described in claim 32, further comprising the step of coating the entire cell structure with a passivation layer; and the Hall sensor lacks a field effect transistor.

* * * * *